United States Patent [19]
Andre

[11] 3,933,123

[45] Jan. 20, 1976

[54] LIQUID PHASE EPITAXY

[75] Inventor: Elie Andre, Herouville Saint-Clair, France

[73] Assignee: U.S. Philips Corporation, New York, N.Y.

[22] Filed: Dec. 19, 1974

[21] Appl. No.: 535,045

Related U.S. Application Data

[63] Continuation of Ser. No. 421,045, Dec. 3, 1973, abandoned, which is a continuation of Ser. No. 270,281, July 10, 1972, abandoned.

[30] Foreign Application Priority Data

July 13, 1971 France .............................. 71.25739

[52] U.S. Cl. ................................ 118/421; 148/171
[51] Int. Cl.² ..................... B05C 11/12; H01L 7/38
[58] Field of Search ................... 118/421, 415, 407; 148/171, 172, 173

[56] References Cited
UNITED STATES PATENTS

| | | | |
|---|---|---|---|
| 3,565,702 | 2/1971 | Nelson | 148/172 |
| 3,664,294 | 5/1972 | Solomon | 118/415 X |
| 3,665,888 | 5/1972 | Bergh et al. | 148/171 X |

*Primary Examiner*—Morris Kaplan
*Attorney, Agent, or Firm*—Frank R. Trifari; Norman N. Spain

[57] ABSTRACT

A method of and a device for the epitaxial deposition of a layer on a monocrystalline substrate from a material in the liquid state, in which during the deposition process apportioned quantities of a second material are added to the said material in the liquid state, a jig being used having a plurality of vertically spaced, fixed and slidable walls for controlling the addition. Application inter alia for the provision of semiconductor layers, for example, of material of the type $A^{III}B^{V}$, in particular from mixed crystals.

4 Claims, 2 Drawing Figures

LIQUID PHASE EPITAXY

This is a continuation, of application Ser. No. 421,045, filed Dec. 3, 1973, which was a continuation of application Ser. No. 270,281, filed July 10, 1972, each application now abandoned.

The present invention relates to an apparatus for epitaxially depositing on a monocrystalline substrate a crystallized layer from a material in the liquid state, in which the substrate and the said material are placed in a jig which is heated by a furnace, the material being formed out of contact with the substrate in the liquid state, said material in the liquid state being then contacted with the substrate surface to be covered by the epitaxial layer, the epitaxial layer being then formed by deposition of the material in the liquid state on the substrate surface. The invention furthermore relates to a crystalline substrate provided with an epitaxial layer obtained by using the above device for the epitaxial deposition of a layer of crystalline material on a monocrystalline substrate by separation from a material in the liquid state.

According to a known apparatus described in applicant's copending application Ser. No. 889,026, filed Dec. 30, 1969, now abandoned, a jig with slidable wall was used in which in a given position of the slidable wall the material in the liquid state was kept out of contact with the substrate after which at a suitable temperature the contact between the material in the melted state and the substrate surface was effected by moving said wall. The epitaxial layer was then deposited from the liquid material on the substrate surface by gradual cooling, after which the material in the melted state was separated from the substrate by again moving the slidable wall. The slidable wall was connected at one end with a drawing mechanism so that the sliding movement of the wall could be operated from outside the furnace.

The separation of epitaxial layers on a monocrystalline carrier was developed in particular in the technology of the manufacture of semiconductor devices and that in particular for separating epitaxial layers of the type $A^{III}B^{V}$, for example, the separation of gallium arsenide from a solution of gallium-arsenide in melted gallium. However, the use of epitaxial layers deposited from the liquid phase is not restricted to semiconductor materials. In general, when the deposition of thin monocrystalline layers on a monocrystalline substrate is desirable and the material for such a layer can be separated from a liquid material, the use of liquid epitaxy is possible in principle.

For example, it is known to obtain in a monocrystalline form a thin layer of a material in which magnetic bubbles, sometimes termed cylindrical magnetic domains, can be produced, for which in particular special oxides may be used, by the epitaxial deposition on a monocrystalline substrate from a non-magnetizable material, in particular also consisting of a suitable oxide, from a material in the liquid state, which material in the liquid state consists, for example of a solution of the oxide components of the layer to be deposited in a low-melting point solvent, for example, lead borate glass.

If desirable, a material of a single or complex compound of a fixed composition may be deposited but in principle it is also possible in this manner to form a monocrystalline layer from mixed crystals, for example, as is usual in the last-mentioned bubble material and also in semiconductor materials, for example, of the $A^{III}B^{V}$ type, for example, gallium aluminium arsenide.

The material in the melted state will in general change its composition due to the deposition process for the formation of the epitaxial layer. A result of this may be that the extra added dopings are inhomogeneously distributed over the layer depth. In particular in the case in which the deposited material consists of a mixed crystal, a considerable variation in the composition of the mixed crystal in the direction of the thickness of the epitaxially deposited layer may occur by difference in segregation of the composing compounds of the mixed crystal. All this may have for its result that the contemplated properties of the epitaxial layer are not obtained as is desirable or that the reproducibility is impeded. It has been found, for example, in manufacturing epitaxial layers from a mixed crystal of gallium arsenide and aluminium arsenide from a solution in gallium that during the deposition the aluminium arsenide segregates so much better that the aluminium content in the liquid material rapidly decreases. The aluminium content in the resulting epitaxial layer gradually decreases from the substrate.

One of the objects of the present invention is to influence, during the deposition of the epitaxial layer, the composition of the material in the liquid state from which said layer is deposited. A particular object is to compensate at least considerably for the above-described decrease of the content of a better segregating component of the deposited material from the substrate surface. According to the invention, a method of the type mentioned in the preamble is characterized in that the material in the liquid state is replenished during the deposition process and/or the composition of said material is varied in that, by displacing at least one slidable wall used in the jig, at least one apportioned quantity of a second material in the liquid state which is separated from the first material is added to the first-mentioned material in the liquid state. In this manner, a junction can be made in the epitaxial layer, for example a p-n junction in forming an epitaxial semiconductor layer, by adding a doping material. The depletion of a certain better segregating component can also be checked by the dosed addition of such a component. This latter method is particularly suitable to be used in depositing a layer from a mixed crystal, in which the larger decrease of the better segregating component or components of said mixed crystal in the material in the liquid state can be compensated for by means of the addition of the apportioned quantity or quantities of liquid material so that the composition of the mixed crystal can be kept constant within reasonable tolerances throughout the epitaxial layer.

When it is sufficient to add only once an apportioned quantity of the material in the liquid state during the epitaxial growth, it is sufficient to provide said apportioned quantity on the slidable wall as such and to give said quantity an opportunity of uniting with the material in the melted state by moving the wall. Preferably, two walls which are situated one on top of the other and are relatively movable are used, the wall which is situated on top of the lower wall comprising at least one aperture in which the apportioned quantity or quantities are provided, the lower wall closing the aperture or apertures on their lower side, the closure of the lower side of at least one aperture being removed by moving the walls relative to each other. It is not necessary for both walls to be movable. It is sufficient that only one of the walls is movable relative to the jig which may be either the lower wall or the wall situated thereabove. By pulling away the lower wall entirely below such an aperture in the wall situated thereabove, the quantity provided in such an aperture may be caused to flow to the material in the melted state. The lower wall preferably comprises at least one aperture and the closure of an aperture in the wall situated thereabove is removed by bringing an aperture in the lower wall below an aperture in the wall situated thereabove by means of the movement of the walls relative to each other. In this manner, for example, comparatively small movements will do. It is furthermore possible in this manner to cause different apportioned quantities to flow simultaneously to the material in the melted state. In particular when the material in the liquid state is used in the form of a layer of liquid, the latter dimensions of which are comparatively large relative to the height occupied by the liquid material, a few apportioned quantities can be added through a number of apertures in the lower wall, simultaneously and divided uniformly over the surface of the material in the liquid state, as a result of which a more rapid mixing to a homogeneous composition of the material in the liquid state is furthered.

Such an apportioned quantity may be provided, prior to the heating process, in such an aperture which can be closed from below the lower wall. According to a preferred embodiment, a third wall may be used on the wall having the apertures which can be closed from below, in which the two last-mentioned walls are slidable relative to each other and the third wall closes the upper side of the aperture or apertures destined for the apportioned quantity or quantities, and a space is present in the jig above the wall in which a melt having the composition of the quantities to be added is provided, in which, by the mutual movement of the two uppermost walls, the closure of the upper side of at least one aperture for the apportioned quantity is removed and the aperture with the apportioned quantity is filled, after which by a further mutual movement of the two uppermost walls an apportioned quantity of the melt situated thereabove is separated. The provision of the apportioned quantity or quantities is preferably carried out via at least one aperture in the uppermost wall. It is self-evident that upon filling the apertures destined for the apportioned quantities and situated in the centre of the two walls, said walls are preferably closed from below by the lower wall. The apportioned quantities are determined by the capacity of the apertures in the central wall. Of course, the upper sides of the apertures in the central wall are preferably closed by the uppermost wall before said apportioned quantities are added in the material in the liquid state. It is, of course, not necessary that all three walls are slidable relative to the jig. For example, the upper and the lower wall may be slidable, while the central wall is fixed in the jig. It is also possible that the upper and lower walls are fixed and that in such manner that the apertures thereof are not situated one above the other. The central wall with the apertures destined for the apportioned quantities may then be constructed so as to be slidable so that said apertures are filled in one position and are emptied in another position. A slidable wall is preferably used also for separating the material in the liquid state and the substrate, as is described in the above-mentioned application Ser. No. 889,026. Preferably, every wall slidable in the jig is connected to a drawing device by means of which the movements are operated. The advantage is that the jig can be placed centrally in a tubular furnace in which a uniform temperature can be better adjusted. Such a central positioning is not so readily possible with a known jig for liquid epitaxy which has to be operated by tilting.

The invention furthermore relates to a device for the epitaxial deposition of a layer of crystalline material on a monocrystalline substrate by deposition from a material in the liquid state, which device is constructed for carrying out the above-described method.

The invention may be used for the epitaxial deposition from a liquid phase, for example, of semiconductor compound in particular for depositing ternary compounds containing the elements of the columns III and V of the periodic system of elements. The invention is particularly suitable for depositing an epitaxial layer of a mixed crystal of gallium arsenide and aluminium arsenide from a solution in gallium to manufacture electroluminescent devices. However, it may also be used for depositing other semi-conductor materials and materials of a different nature, for example, materials in which so-called "magnetic bubbles" can be produced and moved.

The invention will be described in greater detail with reference to the accompanying drawing.

Figure 1:
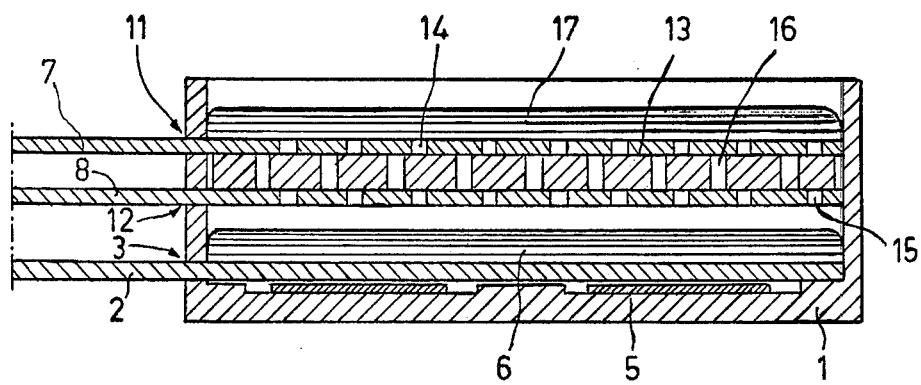
FIG. 1 is a diagrammatic longitudinal cross-sectional view of an embodiment of a jig for use in an embodiment of the method according to the invention.
Figure 2:
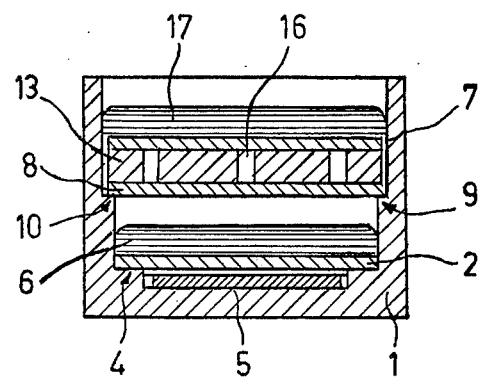
FIG. 2 is a diagrammatic cross-sectional view of said jig.

The device to be described herein after comprises the required means for the embodiment in question of the method according to the present invention. This device consists of a box-like jig 1 in the form of a substantially rectangular parallelepiped. Said jig consists of a suitable material which can withstand considerable temperature variations or temperature rises without change in structure and serious pollution of its contents, for examaple, boron nitride. The crucible 1 comprises a slidable flat wall 2 which is bent parallel to the bottom of the jig and is passed through a slit 3 of a corresponding cross-section and which can slide in the interior of the jig over two ridges 4. One or more substrates 5 which are to be provided with an epitaxial layer can be placed on the bottom of the jig. The slidable wall 2 is placed so, for example, that its lower surface is remote from the substrate by less than a millimeter. At the end of the slidable wall 2 projecting outside the jig a member (not shown) is provided to displace said wall, for example, a hook which can be placed in a hole drilled in said end. The material 6 in the liquid state from which the epitaxial deposition is to be effected is provided on the slidable wall 2.

Two walls 7 and 8 having apertures 14 and 15, respectively, which are slidable in an analogous manner are present above the liquid 6, said walls being passed through slits 11 and 12, respectively, of a corresponding cross-section in the jig. Both slidable walls may be connected, via a connection present outside the box-like space of the jig 1, to a drawing mechanism for controlling said walls, for example, analogous to the control of the slidable wall 2. The slidable wall 8 can slide in the interior of the jig on the ridges 9 and 10. The two slidable walls 9 and 10 are provided on either side of and parallel to a wall 13 having apertures 16 which, in a given position of each of the said slidable walls, can be made to coincide with the apertures 14 and 15 of the slidable walls 7 and 8, respectively. A second material 17 in liquid form is provided on the slidable wall 7 and comprises the element to be added to the liquid in a higher concentration than in the latter, the slidable wall being in such a position that the apertures 14 and 15 do not communicate. The jig is placed in a space (not shown) having a controlled atmosphere, in a furnace in which the temperature can be controlled.

After providing the substrates in their locations and placing the constituents of the liquids 6 and 17 in the jig with the slidable wall in the position shown in FIG. 1, the temperature of the assembly is increased and that at least to the initial temperature required for epitaxy. At the instant and temperature chosen for the deposition, the slidable wall 2 is moved so that the liquid 6 drops on the substrates. The liquid 6 is then cooled, crystalline material being deposited, so that an epitaxial layer is formed on each of the substrates 5. During the deposition the liquid may become poorer in one of the constituents, for example, when using aluminium containing gallium, the gallium melt becomes poorer in aluminium and the concentration of the latter element has a tendency of being decreased in the vicinity of the junction to the epitaxial layer being formed. During the treatment the apertures 16 of the fixed wall 13 are filled with liquid 17 by temporarily bringing the appartures 14 of the movable wall 7 above the appartures 16 and, after filling, closing the appartures 16 again on their upper side by moving the wall 7. After the first deposition phase, when the liquid 6 is rather depleted in the better segregating constituent, the movable wall 8 is moved so that its appartures 15 become located below the appartures 16 of the fixed wall 13, as a result of which the contents of the latter are released and drop into the liquid 6, as a result of which the concentration of the better segregating constituent is increased to a better adapted value.

The filling of the appartures 16 and the pouring of their contents into the liquid 6 may be repeated as many times as is necessary. A cycle may be programmed and the actuation of the movable walls 7 and 8 can easily be automated.

What is claimed is:

1. An assembly for epitaxially depositing a crystallized layer on a monocrystalline substrate from a material in the liquid state, said assembly comprising a jig suitable for heating by a furnace, said jig comprising means for holding a monocrystalline substrate in a base portion of said jig, means for selectively exposing a face of said substrate to a first material in the liquid state including a first slidable wall member adapted to reciprocate in a plane substantially parallel to the base portion of the jig so as to control the exposure of a face of said substrate to a first material in the liquid state held in said jig above said substrate by said first slidable wall portion and side wall portions of said jig contiguous with said first slidable wall portion, said jig further comprising at least two additional wall members at least one of which is apertured and at least one of which is slidable and adapted to reciprocate in a plane substantially parallel to the base portion of said jig said additional wall members being positioned above said first material in the liquid state and below a second material in the liquid state and adapted by slidable movement of said additional wall members relative to each other of controlling the access of said second material in the liquid state to said first material in the liquid state through the apertures in said additional wall members to thereby control the flow of said second material in said liquid state into said first material in said liquid state.

2. The assembly of claim 1 wherein said additional wall members include one apertured wall member fixed relative to the side wall portions of said jig and one slidable apertured wall member extending through a slot in one side wall member to the opposing side wall member of said jig.

3. The assembly of claim 2 wherein said additional wall members include two slidable apertured wall members each extending through a slot in one side wall member to the opposing side wall member of said jig and separated from each other by said fixed apertured wall member.

4. The apparatus of claim 1 wherein the base portion contains at least one recess portion suitable for the positioning of the substrate.

* * * * *